United States Patent [19]
Dozier, II

[11] Patent Number: 5,473,510
[45] Date of Patent: Dec. 5, 1995

[54] LAND GRID ARRAY PACKAGE/CIRCUIT BOARD ASSEMBLIES AND METHODS FOR CONSTRUCTING THE SAME

[75] Inventor: Thomas H. Dozier, II, Carrollton, Tex.

[73] Assignee: Convex Computer Corporation, Richardson, Tex.

[21] Appl. No.: 218,076

[22] Filed: Mar. 25, 1994

[51] Int. Cl.⁶ ..................................... H05K 7/20
[52] U.S. Cl. ................. 361/719; 174/52.4; 361/768; 361/789; 439/66; 439/91
[58] Field of Search .................. 174/52.4, 16.3, 174/254, 260; 439/66, 71, 74, 86, 90, 91, 526, 591; 361/690, 702–705, 719, 735, 741, 752, 756, 760, 764, 767, 768, 784, 785, 789, 790

[56] References Cited

U.S. PATENT DOCUMENTS

| | | |
|---|---|---|
| 4,437,141 | 3/1984 | Prokop . |
| 4,563,725 | 1/1986 | Kirby . |
| 4,906,194 | 3/1990 | Grabbe ........................ 439/71 |
| 4,914,551 | 4/1990 | Anschel ...................... 361/719 |
| 4,969,826 | 11/1990 | Grabbe ........................ 439/66 |
| 5,037,312 | 8/1991 | Casciotti et al. . |
| 5,101,553 | 4/1992 | Carey et al. . |
| 5,109,320 | 4/1992 | Bourdelaise ................ 361/705 |
| 5,123,849 | 6/1992 | Deak et al. . |
| 5,129,833 | 7/1992 | Rowlette, Sr. . |
| 5,151,040 | 9/1992 | Tanaka . |
| 5,159,534 | 10/1992 | Hudson ........................ 361/690 |
| 5,161,983 | 11/1992 | Ohno et al. . |
| 5,199,889 | 4/1993 | McDevitt, Jr. . |
| 5,215,472 | 6/1993 | DelPrete et al. . |
| 5,232,372 | 8/1993 | Bradley et al. . |
| 5,296,652 | 3/1994 | Miller, Jr. ................... 174/265 |

*Primary Examiner*—Gerald P. Tolin
*Attorney, Agent, or Firm*—Fulbright & Jaworski

[57] ABSTRACT

An electrical assembly 100 is provided which includes a land grid array integrated circuit package 103, a socket 104, a printed circuit board 106 and a clamping lid 101. Socket 104 and clamping lid 101 have major surface dimensions no greater than the major surface dimensions of the LGA integrated circuit package 103 in order to limit board space requirements to the minimum required by the circuit package 103. Alignment means associated with integrated circuit package 103, socket 104 and printed circuit board 106 are provided to maintain alignment between contact pads 120 on circuit package 103 and first ends of compressible conductors 111 on socket 104 and between contact pads 122 on circuit board 106 and second ends of compressible conductors 111. In the completed assembly, clamping lid 101 applies pressure to an adjacent surface of integrated circuit package 103 thereby compressing compressible conductors 111 against contact pads 120 and contact pads 122.

15 Claims, 2 Drawing Sheets

LAND GRID ARRAY PACKAGE/CIRCUIT BOARD ASSEMBLIES AND METHODS FOR CONSTRUCTING THE SAME

TECHNICAL FIELD OF THE INVENTION

The present invention relates to land grid array integrated circuits and circuit boards and in particular to land grid array package/circuit board assemblies and methods for constructing the same.

BACKGROUND OF THE INVENTION

Two of the most important factors in the development of smaller integrated circuit packages have been the reduction in size of the integrated circuit chips themselves and the miniaturization of the interconnections used to connect those integrated circuits to printed circuit boards. Unfortunately, while the development of smaller integrated circuits has continued to proceed at a relatively rapid rate as circuit density has been improved, the miniaturization of the pin connectors typically used to connect integrated circuits to printed circuit boards has proceeded at a substantially slower pace. Without sufficiently small pin connectors, the number of connections which can be made to a very small integrated circuits (i.e. the pin connector density) is limited.

The problem of limited pin connector density has become compounded as manufacturing techniques allow greater processing capability to be incorporated into IC chips—the increased capability of the circuit typically demanding an increased number of I/O connections. The need for increased pin density is further complicated by the need to keep the interconnection paths and pins as short as possible in order to accommodate the higher speeds at which state-of-the-art high-speed electronics operate.

Traditional pin grid arrays are incapable of meeting the continually increasing I/O requirements of increasingly dense IC packages. In order to be of sufficient strength and rigidity to provide a solid connection to the printed circuit board, the pins must be of a minimum diameter. Further, increased contact density makes it more difficult and more expensive to solder IC circuits or IC sockets to the printed circuit boards.

The limitations on conventional pin arrays have led to greater use of land grid arrays ("LGAs") since LGAs employ contact pads rather than pins. LGAs advantageously permit significant increases in contact point density and reduce or eliminate the problems associated with the pin attachment, along with most of the associated expense.

Numerous methods of attaching LGA packages to printed circuit boards have been developed. Most of these methods rely upon a socket to align the contact pads on the bottom of the LGA integrated circuit package with contact pads on the printed circuit board (PCB). While the socket provides alignment in the X-Y plane of the board, problems can still arise in maintaining good electrical contact between all of the pads on the LGA IC package and all of the corresponding contact pads on the printed circuit board. These problems typically result from minor variations in the contours of the PCB surface and the bottom surface of the integrated circuit package which cause extremely small gaps to be created between corresponding contact pads.

To eliminate the creation of gaps between corresponding contact pads, many LGA assemblies utilize an interconnection array of conductor pins interposed between the LGA IC package and the printed circuit board. The interconnection array typically is fabricated of a compressible conductive material that completely fills the space between the contact pad on the IC package and the contact pad on the PCB when sufficient pressure is applied to the top of the IC package. As the integrated circuit is forced down on the interconnecting array, high spots on the PCB flatten the compressible conductors of the interconnecting array more than low spots on the PCB. Typically, this pressure is permanently maintained by use of a clamping lid, which quite often is a conventional IC heat sink, which sits on top of the integrated circuit package and is held down by screws that pass through into the printed circuit board. While the interconnecting array is typically a separate component sitting inside the LGA IC alignment socket along with the LGA IC, the alignment socket and the interconnecting array may alternatively be a single integrated unit. Additionally, many printed circuit boards will have a backing plate on their reverse side for added strength.

There are numerous problems with present methods of assembling LGA IC packages to printed circuit boards. LGA sockets typically use the edge of the IC package for alignment. By necessity, this requires that the socket be larger in size than the LGA package it is aligning (i.e., the IC package fits within the socket). Therefore, the "footprint" or board space occupied by the IC package and socket is greater than that occupied by the IC package alone. High speed computing systems however are extremely sensitive to PCB space limitations. Among other things, it is critical in such systems to minimize line length in order to minimize signal noise and maximize operating speed. It is therefore essential that the real estate occupied by an LGA IC circuit be the minimum possible, preferably limited to the footprint of the IC package rather than the larger footprint of the socket.

The present methods of connecting LGA IC packages to printed circuit boards are also subject to force tolerance problems associated with the compression of the conductors in the interconnecting array by the LGA package. In many LGA assemblies, the LGA socket and the interconnecting array are one integral component. Such LGA sockets use either a spring to apply a controlled force or the clamping lid/heat sink to press the package into the socket to a fixed point. These LGA sockets are therefore very sensitive to the package thickness. As mentioned previously, the clamping lid/heat sink may be attached to the socket by screws which, when tightened, force the clamping lid/heat sink down onto the LGA package. To align the holes in the socket with those in the board, the clamping lid must also be larger than the IC package. Excess force used to tighten the screws on the clamping lid/heat sink will cause the heat sink to bow around the IC package, possibly damaging the corners of the IC package, or even bowing the IC package.

Another problem related to the attachment of LGA IC packages to printed circuit boards concerns the location of series termination/isolation resistors in selected data lines of the IC. High speed computer printed circuit boards have a system performance requirement of providing electrical isolation between the high speed signal lines in the printed circuit board and the IC component. The use and location of termination/isolation resistors is critical to achieve this electrical isolation. Ideally, isolation resistors should be placed very close to the high speed signal line on the IC package so that there is minimal disruption of the signal integrity. In most systems, isolation/termination resistors are either mounted on the surface of the printed circuit board or buried within the board itself. Adding surface mounted resistors typically does not achieve the isolation desired due to the normal distance of the resistors from the IC package. Surface mounted resistors also use additional critical board space. Adding the buried layer resistors significantly increases the complexity of the printed circuit board and normally requires the addition of vias to the printed circuit board, which may not be feasible in the area needed. Finally, the use of buried resistors has the additional drawback of requiring constant circuit board modification whenever additional or differing isolation resistors are required during laboratory debugging of the computer system.

Thus, a need has arisen for apparatus and methods for minimizing the size and complexity of the devices used to attach land grid array IC packages to printed circuit boards. Furthermore, a need has arisen for apparatus and methods of attaching LGA IC packages of various thicknesses to printed circuit boards without creating force tolerance problems that may damage the IC package or conductors in the alignment socket. Finally, a need has arisen for apparatus and methods of providing series termination/isolation resistors for selected lines of land grid array packages without increasing the complexity of the main printed circuit board and without using any additional board real estate.

SUMMARY OF THE INVENTION

One embodiment of the present invention meets the high density contact requirements of state-of-the-art high speed processing systems by use of a multilayered electrical apparatus that includes a land grid array (LGA) integrated circuit, a thin flat socket containing a plurality of compressible conductors which has dimensions no greater than the dimensions of the integrated circuit package, a heat sink or clamping lid that also has dimensions no greater than the dimensions of the integrated circuit package, and a printed circuit board. An alignment post in the socket inserts into a hole in the circuit package and also into a hole on the printed circuit board to properly align the compressible conductors of the socket with the contacts on the LGA circuit package and the contacts on the printed circuit board. In other embodiments of the present invention, the alignment post may be separate posts that extend from only one face of the socket, rather than one or more individual posts that extend from both faces of the socket. Screws that pass through the clamping lid or heat sink, the LGA circuit package, and the socket and into press nuts in the printed circuit board are used to tighten the assembly in place and also to provide additional alignment. A backing plate may, in some embodiments, be attached to the reverse side of the printed circuit board using screws that insert into the opposite ends of the press nuts. A termination/isolation resistor board whose dimensions are no greater than the dimensions of the LGA circuit package may be inserted under the socket in some embodiments to provide electrical isolation.

BRIEF DESCRIPTION OF THE DRAWINGS

For a more complete understanding of the present invention, and the advantages thereof, reference is now made to the following descriptions taken in conjunction with the accompanying drawings in which.

DETAILED DESCRIPTION OF THE INVENTION

Figure 1:
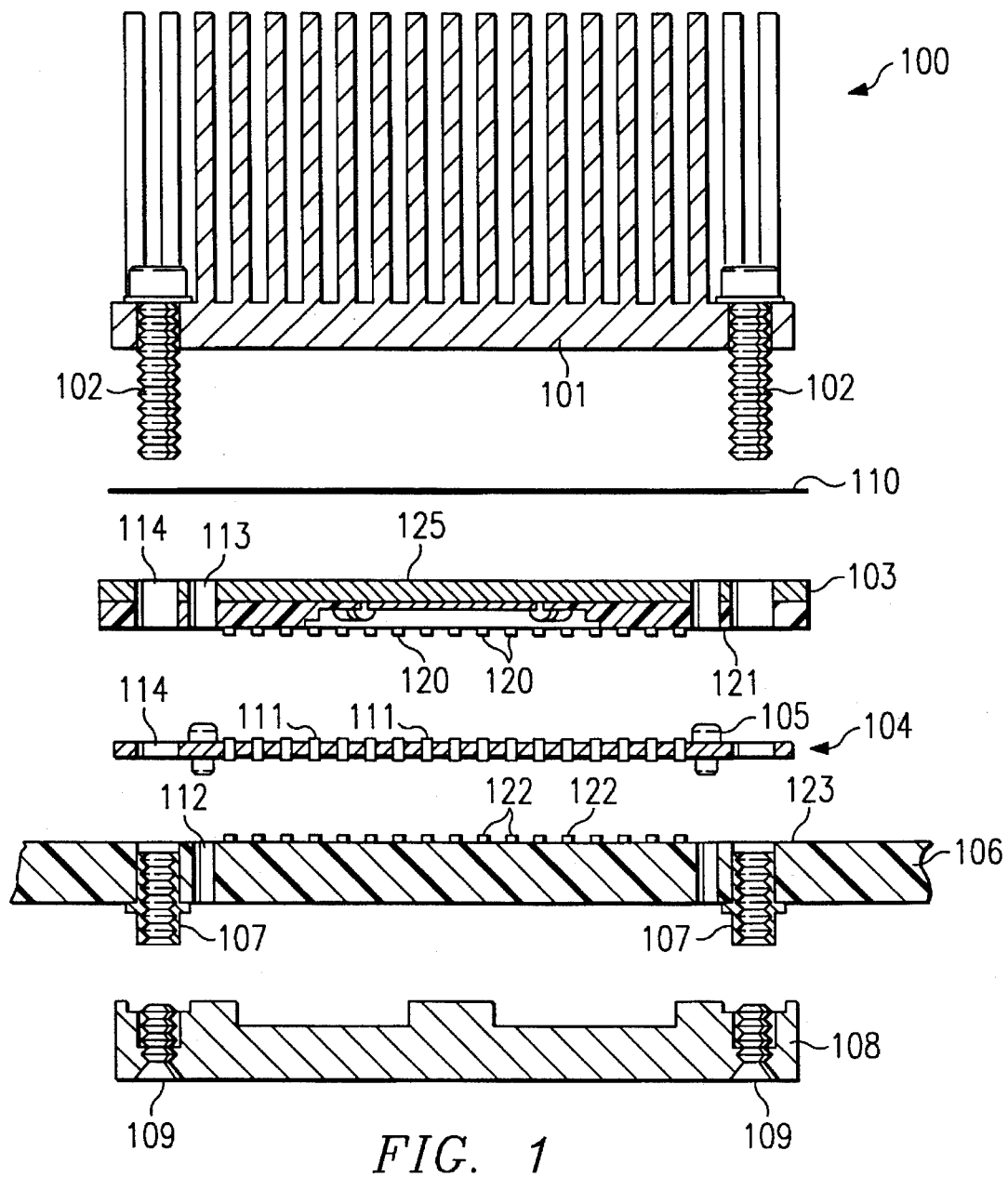
FIG. 1 is an exploded cross-sectional view of a land grid array package/circuit board assembly embodying the present invention.
Figure 2:
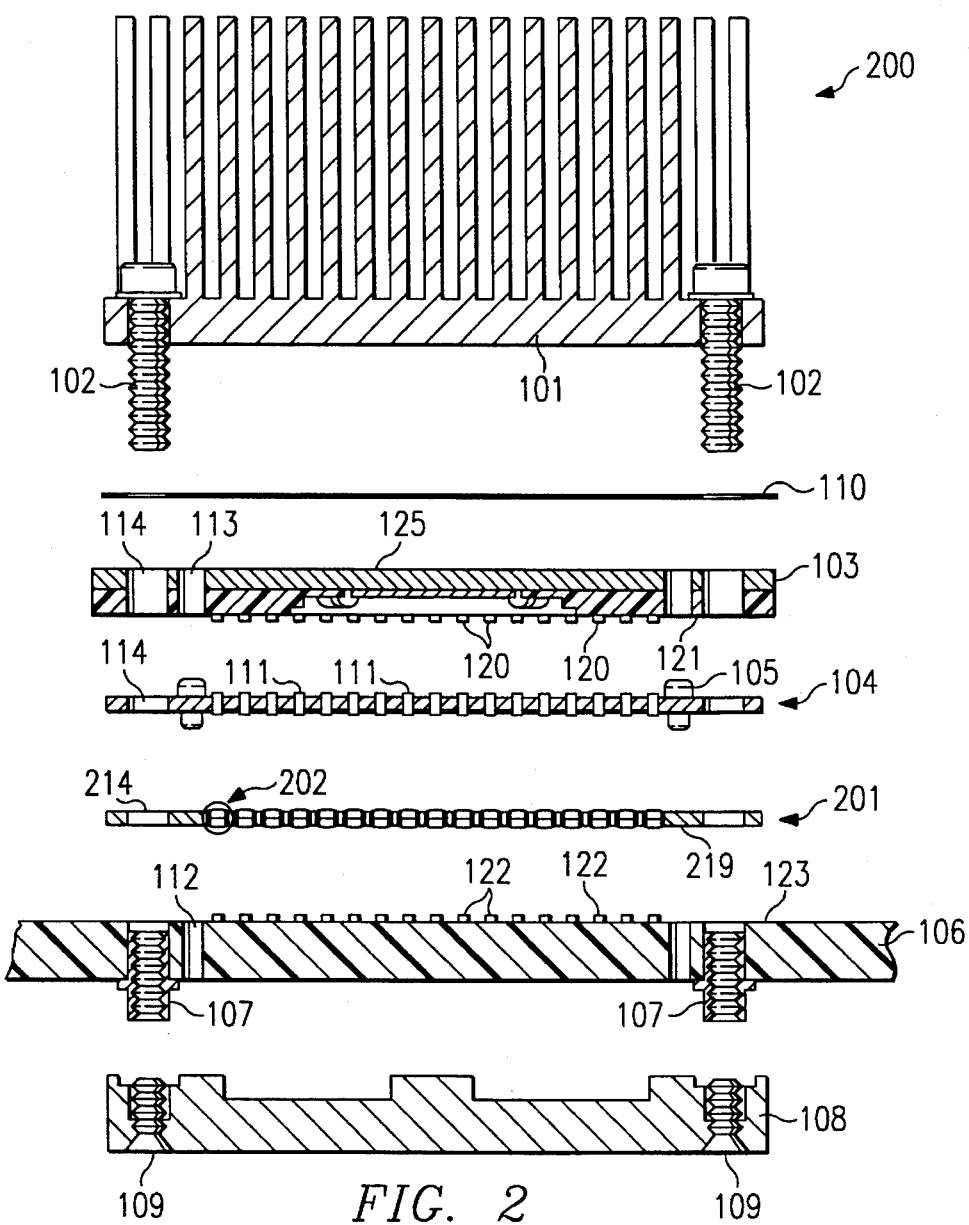
FIG. 2 is an exploded cross-sectional view of another land grid array/circuit board assembly embodying present invention which includes a resistor series termination board.
Figure 3:
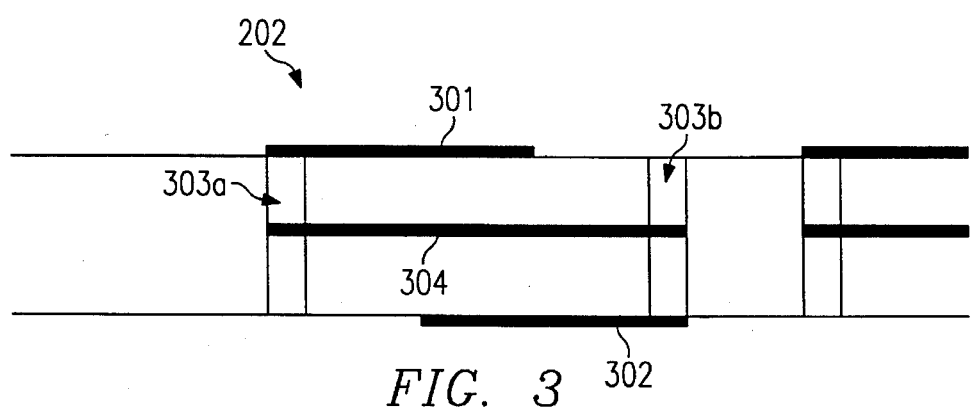
FIG. 3 is an enlarged cross-sectional view of the series resistor termination board depicted in FIG. 2.

The principles of the present invention and their advantages are best understood by referring to the illustrated embodiments depicted in FIGS. 1–3 of the drawings.

FIG. 1 is an exploded cross-sectional view of a land grid array (LGA) package assembly 100 according to one embodiment of the present invention. The primary components of assembly 100 include a heat sink 101, a land grid array integrated circuit (LGA IC) package 103, a thin IC socket 104, and a printed circuit board (PCB) 106.

LGA IC package 103 includes contact pads 120 on surface 121 for contacting corresponding contact pads 122 on an opposing surface 123 of PCB 106. Thin IC socket 104 includes at least a pair alignment posts 105 a plurality of socket conductor pins 111, all of which pass entirely through the body of socket 104. Alignment posts 105 are adapted for insertion through corresponding alignment holes 112 in PCB 106 and alignment holes 113 in IC package 103. Alignment posts 105 ensure proper alignment of IC contact pads 120 with the PCB contact pads 122 in completed assembly 100.

Heat sink 101 is adapted for positioning on surface 125 of IC package 103. In some embodiments, a thin layer of adhesive 110 may be used between the heat sink 101 and the IC package 103. Screws 102 pass through heat sink 101, through screw holes 114 in IC package 103 and socket 104, and finally into threaded press nuts 107 in the PCB 106. When the screws 102 are tightened, heat sink 101 is pulled toward PCB 106, thereby pressing the contact pads 120 of IC package 103 onto the socket conductor pins 111 in socket 104. The opposite ends of the socket conductor pins 111 in turn press down on the contact pads 122 of the PCB 106, thereby by creating an electrical connection. Advantageously, screws 102 need only be tightened slightly in excess of the torque needed to compress socket conductor pins 111 in order to establish a good electrical contact from the IC package 103 to the PCB 106.

In some embodiments, a backing plate 108 is attached to the opposing side of PCB 106 by means of screws 109 which insert into the ends of press nuts 107 opposite from those receiving screws 102. This allows backing plate 108 to be removed without disturbing the LGA socket connections whenever it is necessary to gain electrical access to contact pads on the back of PCB 106 in order to isolate problems on failing board assemblies.

FIG. 2 is an exploded cross-sectional view of an LGA package assembly 200 according to a second embodiment of the present invention. The embodiment of FIG. 2 is nearly identical to that shown in FIG. 1 except for a series termination/isolation resistor board 201 inserted between socket 104 and PCB 106. A selected circled element 202 of resistor board 201 is shown in enlarged detail in FIG. 3.

Resistor board element 202 includes a first contact pad 301 for contacting corresponding a socket conductor pin 111 when resistor board 201 is inserted into the IC package assembly 200 and a second contact pad 302 for contacting a corresponding pad 122 on surface 123 of the PCB 206. A via 303a connects contact pad 301 with buried layer element 304 and via 303b connects contact pad 302 with buried element 304. Buried layer element 304 may be a resistor or a conductor, thereby enabling the designer to isolate data lines (by using a series resistor) or directly connect the data line to other circuit elements (by using a conductor). The use of the series resistor termination board 300 rather than surface mounted or buried-layer resistors on the PCB 106 allows the system to be modified without redesigning the PCB 106 whenever isolation resistors are added. Since the series resistor termination board 201 is directly underneath the LGA IC package 103 and is conformal with its dimensions, no additional board space is used and line lengths are minimized, thereby overcoming the board space limitations and noise problems in the prior art. Series resistor termination board 201 includes alignment holes 219 and screw holes 214 for aligning and fastening series resistor termination board 201 to the circuit board 106.

As FIG. 1 and FIG. 2 show, the clamping lid/heat sink 101, the socket 104, and the series resistor termination board 201 have the same dimensions as LGA IC package 103. This eliminates the problems associated with the prior art wherein the socket and the clamping lid exceeded the IC package size and increased the board space needed by the IC package. Also, in the embodiments shown, the screws 102 pass through holes in the corners of IC package 103, socket 104, and resistor board 201. If excess torque is applied to the screws 102, the corner of the IC package 103 where the screw holes are located will absorb the excess. Advantageously, heat sink 101 will not bow in the center around the IC package 103, as in the prior art, because the IC package 103 is no longer located between the screws 102, as in the prior art.

Socket compression in the prior art created problems because the IC packages were pressed down into the socket to a fixed point, which made the socket very sensitive to package thickness. In the embodiments of the present invention, compression is limited by the socket thickness. Socket 104 is compressed the same amount each time regardless of the IC package thickness. The screws 102 are tightened to a torque that is sufficient to compress the socket conductor pins 111. Excess force is absorbed by the corner of the package.

The use of press nuts 107, which are threaded from both ends, allows the backing plate to be removed by loosening screws 109, without disturbing the components on the opposite side of the PCB 106, which are held in place by screw 102. This provides electrical access to contact points on the bottom of PCB 106 in order to isolate problems on failing board assemblies.

What is claimed is:

1. An assembly comprising:
   an integrated circuit package including a first surface having a plurality of contact pads thereon, a plurality of screw holes passing through said first surface and an opposing second surface of said package, and at least one alignment means separate from said screw holes associated with said first surface of said package;
   a printed circuit board including a first surface having a plurality of contact pads thereon, a plurality of threaded press nuts disposed within said circuit board, and at least one alignment means associated with said first surface of said circuit board;
   a socket, disposed between said package and said circuit board, having a first surface and an opposing second surface, wherein said first surface of said socket is disposed adjacent to said first surface of said package and wherein a perimeter of said first surface of said socket is positionable entirely within a perimeter of said first surface of said package, said socket further comprising:
      a plurality of screw holes passing through said first and second surfaces of said socket;
      a plurality of compressible electrical conductors each having a first end extending from said first surface of said socket and a second end extending from said second surface of said socket; and
      at least one alignment means interfacing with said alignment means of said package and said circuit board for maintaining alignment between said contact pads of said package and said first ends of said compressible conductors and between said contact pads of said circuit board and said second ends of said compressible conductors; and
   a clamping lid having a surface disposed adjacent to said second surface of said package and a plurality of screw holes passing through said clamping lid, wherein a perimeter of said clamping lid is positionable entirely within a perimeter of said second surface of said package and wherein said clamping lid compresses said compressible conductors in response to tightening screws which pass through corresponding said screw holes of said clamping lid, said package, said socket, and into said threaded press nuts.

2. The assembly of claim 1 and further including a backing plate attached to a second surface opposing said first surface of said circuit board, said backing plate having a plurality of screw holes passing through said backing plate, and wherein said backing plate is attached to said board by tightening screws which pass through said screw holes in said backing plate and into said threaded press nuts in said circuit board.

3. The assembly of claim 1 wherein said clamping lid comprises a heat sink.

4. The assembly of claim 1 wherein said at least one alignment means of said socket comprises at least one post, said at least one alignment means of said circuit board comprises at least one hole, and said at least one alignment means of said package comprises at least one hole.

5. The assembly of claim 1 and further including a termination board disposed between said circuit board and said socket and having a first surface and an opposing second surface, wherein said first surface of said termination board is disposed adjacent to said circuit board and wherein a perimeter of said first surface of said termination board is positionable entirely within a perimeter of said first surface of said package, said termination board comprising:
   a plurality of screw holes passing through said first and second surfaces of said termination board;
   a plurality of contact pads disposed adjacent each said first and second surface of said termination board;
   a plurality of vias extending from said first surface of said termination board to said second surface of said termination board;
   a plurality of conductors embedded in said termination board wherein each conductor is coupled to at least first and second ones of said vias; and
   at least one alignment means for maintaining alignment between said contact pads on said first surface of said termination board and said second ends of said compressible conductors and between said contact pads on said second surface of said termination board and said contact pads on said first surface of said printed circuit board.

6. The assembly of claim 5 wherein said termination board comprises at least one embedded resistor coupled to at least first and second ones of said vias.

7. The assembly of claim 5 wherein said at least one alignment means of said socket comprises at least one post, said at least one alignment means of said circuit board comprises at least one hole, said at least one alignment means of said package comprises at least one hole, and said at least one alignment means of termination board comprises at least one hole passing through said termination board.

8. The assembly of claim 6 wherein said at least one alignment means of said socket comprises at least one post, said at least one alignment means of said circuit board comprises at least one hole, said at least one alignment means of said package comprises at least one hole, and said at least one alignment means of said termination board comprises at least one hole passing through said termination board.

9. The assembly of claim 2 wherein a perimeter of a first surface of said backing plate disposed adjacent said second surface of said circuit board is positionable entirely within said perimeter of said first surface of said package.

10. The assembly of claim 1 wherein said screw holes passing through said package are disposed adjacent corners of said package.

11. The assembly of claim 10 wherein said screw holes passing through said socket are disposed adjacent corners of said socket.

12. The assembly of claim 1 and further comprising a layer of adhesive disposed between said package and said clamping lid.

13. A land grid array/circuit board assembly:
- an integrated circuit package including a surface having a plurality of contact pads thereon and at least one alignment means;
- a printed circuit board including a surface having a plurality of contact pads thereon, and at least one alignment means;
- a socket disposed between said package and said circuit board and having first and second opposing surfaces, said first surface disposed adjacent to said circuit package and having a perimeter positionable entirely within a perimeter of said surface of said package, comprising:
  a plurality of compressible electrical conductors each having a first end extending from said first surface and a second end extending from said second surface; and
  at least one alignment means interfacing with said alignment means of said package and said circuit board for maintaining alignment between said contact pads of said package and said first ends of said conductors and between said contact pads of said circuit board and said second ends of said conductors;
- a clamping lid having a surface disposed adjacent to a second surface of said package and having perimeter positionable entirely within a perimeter of said second surface of said package; and
- means, separate from said at least one alignment means, for maintaining said clamping lid, said package, said conductors and said circuit board in compressed communication.

14. The assembly of claim 13 wherein said means for maintaining comprises:
- a plurality of screw holes passing through said surfaces of said package;
- a plurality of screw holes passing through said socket;
- a plurality of threaded press nuts disposed within said circuit board; and
- a plurality of screws each of which pass through a corresponding said screw hole, said clamping lid, said package, said socket, and into said threaded press nuts, said press nuts retaining said assembly in compressed communication.

15. The assembly of claim 13 wherein said at least one alignment means of said socket comprises at least one post, said at least one alignment means of said circuit board comprises at least one hole, and said at least one alignment means of said package comprises at least one hole.

* * * * *